United States Patent [19]
Grote et al.

[11] Patent Number: 5,432,927
[45] Date of Patent: Jul. 11, 1995

[54] FAIL-SAFE EEPROM BASED REWRITABLE BOOT SYSTEM

[75] Inventors: Jack A. Grote, Sunbury; John W. Lydic, Jr., Raymond, both of Ohio

[73] Assignee: Eaton Corporation, Cleveland, Ohio

[21] Appl. No.: 340,803

[22] Filed: Nov. 17, 1994

Related U.S. Application Data

[63] Continuation of Ser. No. 900,199, Jun. 17, 1992, abandoned.

[51] Int. Cl.⁶ .................. G06F 11/34; G06F 11/00
[52] U.S. Cl. .................................. 395/575; 391/12
[58] Field of Search ............ 395/575; 364/243, 243.3, 364/243.4, 244.6, 242.3, 247, 928, 965, 965.76, 964.1, 975.2, 280.2, 280.3, 285.2; 365/230.01, 240, 201, 189, 226; 371/12

[56] References Cited

U.S. PATENT DOCUMENTS

| | | | |
|---|---|---|---|
| 4,070,704 | 1/1978 | Calle et al. | 364/200 |
| 4,430,704 | 2/1984 | Page et al. | 364/200 |
| 4,597,052 | 6/1986 | Matsuda et al. | 364/550 |
| 4,635,258 | 1/1987 | Salowe | 371/16 |
| 4,654,821 | 3/1987 | Lapp | 364/900 |
| 4,663,707 | 5/1987 | Dawson | 364/200 |
| 4,752,871 | 6/1988 | Sparks et al. | 364/200 |
| 4,930,128 | 5/1990 | Suzuki et al. | 371/12 |
| 4,982,404 | 1/1991 | Hartman | 371/16.3 |
| 5,101,490 | 3/1992 | Getson, Jr. et al. | 395/425 |
| 5,155,844 | 10/1992 | Cheny et al. | 395/575 |
| 5,210,854 | 5/1993 | Beaverton et al. | 395/500 |
| 5,233,614 | 8/1993 | Singh | 371/21.6 |

OTHER PUBLICATIONS

Dialog Printout.
Rosch, Winn, "FlashCard's Flash Memory Delivers Security for Diskless Workstations," PC Magazine, May, 1991, p. 49.
Soja, Richard, "single Chip MCU EEPROM Programming Using Bootstrap Techniques," Electronic Engineering, Oct. 1988, pp. 75–80.
"Research Disclosure Index," Research Disclosure, Jun. 1991 326, p. 427.
"MC68705P3 Advance Information," Motorola Microcomputer, 1984, pp. 3-827-3-850.

Primary Examiner—Robert W. Beausoliel, Jr.
Assistant Examiner—T. Tu
Attorney, Agent, or Firm—Calfee Halter & Griswold

[57] ABSTRACT

A computer boot strap loading system employs dual, separable EEPROM units to facilitate safe reprogramming of bootstrap loader software. Both EEPROMs are adapted for storing bootstrap loading code. One of these two EEPROM areas is designated as the unit for which the code content will govern operation of the next reboot sequence. Circuitry is provided to monitor progress of a reboot to determine if a defect in the presently utilized reboot sequence is provided. Such a defect triggers a reboot from the other EEPROM as well as to provide a back-up copy of the bootstrap loading code most recently determined to be effective.

18 Claims, 3 Drawing Sheets

FAIL-SAFE EEPROM BASED REWRITABLE BOOT SYSTEM

This is a continuation of application Ser. No. 07/900,199 filed on Jun. 17, 1992, now abandoned.

BACKGROUND OF THE INVENTION

This application pertains to the art of bootstrap loading systems for digital computers, and more particularly to bootstrap loaders which facilitate replacement or modification of their non-volatile constituent.

The invention as particularly applicable to computer systems employed in relatively hostile or industrial environments, especially those in which functional operation is critical. The invention will be described with particular reference thereto, although it will be appreciated that the invention has broader application such as in any computer system in which a safe, programmable, reboot sequence is advantageous.

Present computer systems must be brought from a "cold" or off state to a state from which usable functionality may be achieved. That is to say, a computer will have no ability to accomplish such functions as interacting with its environment or running of software applications until sufficient operating system or kernel software has been loaded.

Commencement of the software loading process is accomplished by a series of levels of increasing complexity. The way which a computer utilizes such a sequence to get started is analogized to picking itself up by its bootstraps. Hence the term "boot" has been applied to the process. The first level is provided in non-volatile, random access memory which commences at a default address. Upon power up or reboot, a computer is hard-wired to commence operation of a software routine at this address. These fixed instructions typically have just enough intelligence to seek out the next tier of the program loading sequence, often stored on rotating media such as a fixed disk. Other systems employ only random access memory ("RAM") but still require a bootstrap loading sequence of increasing complexity.

Since at least the first level of bootstrap software must be permanently or semi-permanently stored, earlier systems provided this code within a segment of read only memory ("ROM"). Later systems recognized that it is often advantageous or even necessary to update this formerly permanent segment of the bootstrap loading system. Ultraviolet erasable programmable read-only memory ("UV-EPROM") provided a first level of rewritability. Such UV-EPROMs are fabricated with an ultraviolet permeable window. Exposure to UV light of a sufficient intensity and duration functions to erase the chip, allowing for reprogramming of its contents by a dedicated "burner." Another option is permanent substitution of the earlier ROM chip to a chip employing the updated or modified code.

More recent developments in non-volatile memory included electrically erasable programmable read-only memory ("EEPROM"). EEPROMs facilitate semi-permanent or non-volatile memory which may be reprogrammed on an address-by-address basis. Such memories retain their data content when power is removed. A disadvantage associated with EEPROM is a requirement that a substantially increased voltage must be applied to facilitate programming. These increased voltage levels preclude software supervised rewrites from a routine disposed in the same EEPROM for which a write or programming is to be made.

Earlier bootstrap-loading circuits employing EEPROM have addressed the varying voltage level programmability concern in several ways. In a first, the address space of a CPU was divided into a portion on the EEPROM and another portion in a RAM or ROM region. This segmentation facilitated reprogramming under supervision or control of a non-EEPROM constituent program. A disadvantage associated with an ability to reprogram any address space was addressed by use of first and second EEPROM unit, one or both of which could be reprogrammed under the direction of code disposed in the other. Another disadvantage is that a finite number of rewrites are possible with standard EEPROMs.

More recent developments in the area of EEPROM include "Flash EEPROMs." Flash EEPROMs allow for virtually unlimited rewrites with no deleterious effect. However, like earlier EEPROMs, programmability concerns attributed to enhanced voltage levels required therefor are still present.

Computer systems presently find themselves in many industrial environments. Such environments are relatively hostile to electronic components. Such systems are often provided in critical applications or industrial process management or control. Since such systems are often stand-alone systems, sufficient code to reboot them must be provided independently in each. Modification or enhancement of bootstrap loading code would advantageously be accomplished with minimized down time of the associated computer, such as might be realized if entire ROM chips would have to be physically removed. In addition, on-line bootstrap load reprogram may result in corrupted code if a faulty boot code is entered or if a reprogramming sequence is interrupted due to power spikes, failures, error or the like. These problems, which are more common in industrial environments, are exacerbated by the critical nature of such systems and the time consuming process associated with programming EEPROMs.

The present invention contemplates a new and improved on-line bootstrap loader reprogramming system which overcomes all of the above-referred problems, and others, and provides a means by which an entire bootstrap loader ROM base constituent may be replaced with minimal machine down time and minimal risk.

SUMMARY OF THE INVENTION

In accordance with the present invention, there is provided a computer systems which employs first and second EEPROM regions, both of which are adapted for storage of bootstrap loader code. One of these regions is designated as that which will be utilized to oversee the next machine reboot. A watchdog timer is provided to designate the other EEPROM region to oversee the next reboot in the event a last reboot is deemed to be a failure, and to commence the next reboot. Additional circuitry is provided to monitor whether the present boot sequence is to the alternate boot code which indicates a failure in the previous reboot. Additional circuitry provides for updating the EEPROM region not utilized for an instant reboot sequence in the event the instant reboot sequence is deemed to be effective. Additional circuitry is provided to facilitate recommencement of a load of updated boot software in the event such a last update was incomplete or faulty.

In accordance with a more limited aspect of the present invention, selection of an EEPROM region to accomplish the next reboot is done by a means for masking the address of one or the other EEPROM region into the address base of at least one central processor unit.

In addition with a yet more limited aspect of the present invention, the watchdog timer is periodically reset by operation of a successful bootstrap sequence to preclude a timing out thereof.

An advantage of the present invention is the provision of a system which allows for reprogramming an entire bootstrap sequence with minimal chance of a system lock-out from faulty reboot code.

Yet another advantage of the present invention is the provision of a system by which back-up boot code is provided to a most-recently implement bootstrap sequence which has been determined to be successful.

Further advantages will become apparent to one of ordinary skill in the art upon a reading and understanding of the following detailed description.

BRIEF DESCRIPTION OF THE DRAWINGS

The invention may take physical form in certain parts and arrangements of parts as well as the performance of specified steps, a preferred embodiment of which will be described in detail in this specification and illustrated in the accompanying drawings which form a part hereof, and wherein.

DETAILED DESCRIPTION OF THE PREFERRED EMBODIMENT

Figure 1:
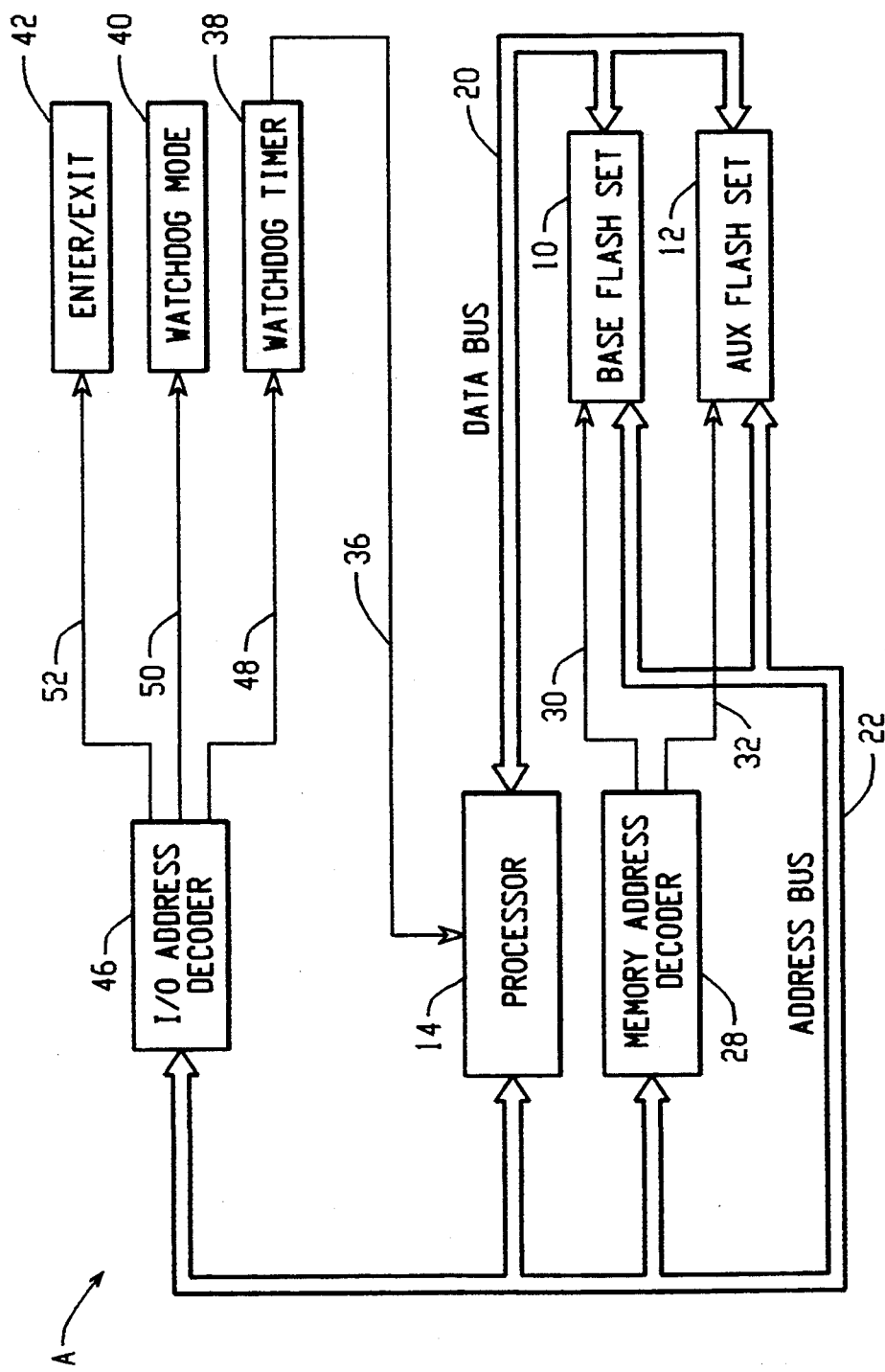
FIG. 1 illustrates, in block diagram form, the hardware embodiment of the updatable firmware bootstrap loader systems of the subject invention.

Referring now to the drawings, wherein the showings are for purposes of illustrating the preferred embodiment of the invention only, and not for the purpose of limiting same, the hardware constituent portion of the fail-safe reprogrammable boot-strap loader systems of the subject invention is provided generally at A. A base flash set or bootstrap loader sequence storage unit 10 is formed from a first EEPROM constituent unit which, in the preferred embodiment is flash EEPROM. An auxiliary flash set or bootstrap loader sequence storage unit 12 is similarly comprised of EEPROM and advantageously flash EEPROM.

Each of the base flash set 10 and the auxiliary flash set 12 is placed within the address space of a processor or central processor ("CPU") 14. Data communication between the processor 14 and flash sets 10 and 12 is accomplished via a data bus 20 in accordance with an address provided on address bus 22.

In the subject system, the flash sets 10 and 12 are utilized for instruction storage and more particularly for storage of bootstrap loader sequences. A memory address decoder 28 facilitates selective masking of one of base flash set 10 and auxiliary flash set 12 via control lines 30 and 32, respectively. The memory address decoder 28 selectively maps memory of either flash set to the address base associated with processor 14. In a non-remap mode, the memory address space associated with base flash set 10 is provided to the processor 14. In a remap mode, the address space of auxiliary flash set 12 is provided to the processor 14. Both flash sets 10 and 12 are available for instruction execution at all times in the preferred embodiment. One is mapped to contain vectors and bootstrap instructions.

Non-remap mode is the normal running mode in which the base flash EEPROM set provided in base flash set 10 appears at a boot address and includes system vectors and system bootstrap instructions. Remap mode is used during reprogramming of the base flash set 10. This mode causes the auxiliary flash set 12 to appear at the boot address of CPU 14 and contains the system vectors and system bootstrap instructions.

The processor 14 is also connected, via control line 36, to a watchdog timer 38. The watchdog timer 38 is, in the preferred embodiment, a hardware counter. The control line 30 provides a means by which an reset may be provided to processor 14. This interrupt is utilized to reset a halted or runaway processor and execute a set routine, the particulars of which will be described further below. The watchdog timer 38 is advantageously provided with a selected timeout duration, the tolling of which will generate a reset to the processor 14 via control line 36. In the preferred embodiment, such an interrupt is avoided by requiring the firmware bootstrap loader sequence disposed in the flash set currently utilized to accomplish a system boot to periodically reset the timer mechanism. In the event of any failure in the boot code, this feed will not occur and the processor will be reset accordingly.

In the preferred embodiment, if a watchdog time-out occurs while the watchdog is armed to enter remap mode, the circuit will enter remap mode in addition to resetting the processor. The auxiliary flash set 12 is mapped to the address space of the CPU 14 which contain reset vectors and boot program instructions. In this instance, a memory address decoder 28 sets the base flash set 10 to an alternate address. The system is then reset to boot from the code provided in the auxiliary flash set 12. In this fashion, the software is suitably enabled to set up the watchdog timer as a protection against power failure during programming of boot code. The watchdog timer 38 is advantageously armed to enter remap mode only during this time so that the timer will only cause such a remap to occur if a possibility remains that the boot code has been corrupted. The particular means by which this system achieved will be described in greater detail below.

The watchdog timer 38, watchdog mode circuitry 40, and enter/exit mode circuitry 42 are all controlled by an I/O address decoder 46. The I/O address decoder 46 is in data communication with address bus 22. Interconnection between watchdog timer 38, WD mode circuitry 40 and enter/exit mode 42 and I/O address decoder 46 is accomplished by a control line 48, 50, and 52, respectively. The enter/exit circuitry 42 facilitates software control of entry to and exit from the remap mode. Software can, via application of appropriate address information onto bus 22, provide a signal on control line 52, via I/O address decoder 46, to cause entry to remap mode or exit therefrom. Similarly, proper address is provided on I/O address decoder will be decoded so as to result in a signal on control line 50 to dictate whether the watchdog timer 38 will cause the system to enter or exit remap mode.

Figure 2:
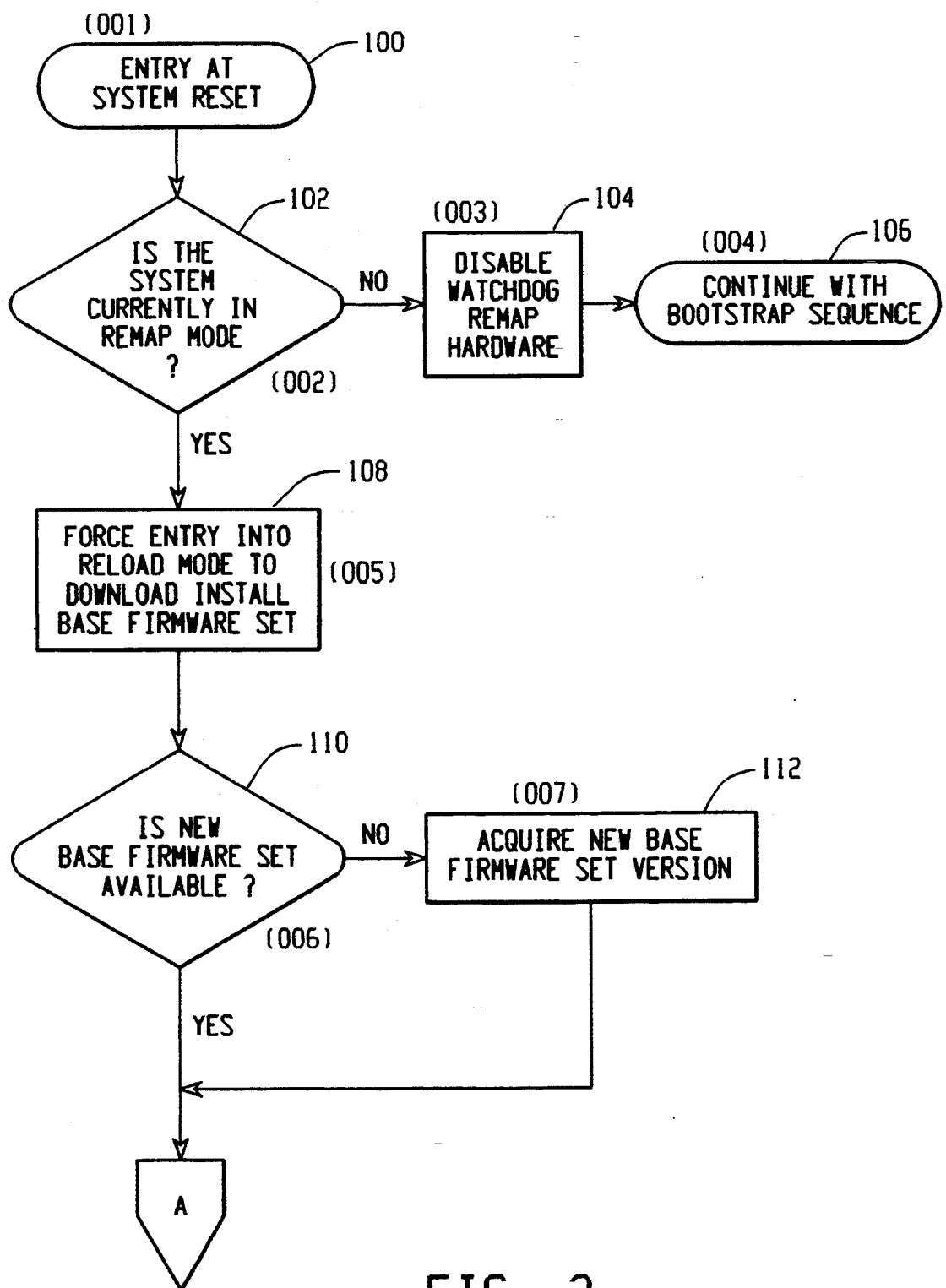
FIG. 2 illustrates, in flow chart form, a commencement of the subject system for accomplishing a fail-safe, updatable reboot sequence; and, FIG. 3 illustrates, in flow chart form, a continuation of the system commenced in FIG. 2.

Turning now to FIG. 2, the actual system for providing the fail-safe bootstrap loader reprogramming will be described with greater particularity. A re-boot or system reset places a hard wired address into the program register of CPU 14 (FIG. 1). This is listed at block 100. Entry to block 100 is achievable on a normal reset or power-up, or alternatively as a result of a corrupt boot set which has allowed a remap and reset to occur.

From block 100, the system progresses to block 102, at which point a determination as to whether the system is presently in remap mode is made. If a determination is made, in block 102, that the system is not in remap mode, progress is made to block 104. At this point, remap circuitry is disabled. Normal bootstrap sequence is continued at block 106.

In the event a determination is made, in block 102, that the system is in remap mode, progress is made to block 108. At block 108, reload mode is entered. This forces a download and installation of a valid bootstrap firmware set.

From block 108, progress is made to block 110. At this point, a programmer mechanism for a reload mode sequence is provided. Entry to such a reloaded programming sequence is provided from two alternative sources. In a first, manual selection is made to allow a new system program to downloaded and installed. In a second source, automatic installation of a new system program is facilitated by a recovery mechanism of the boot sequence. In either instance, a determination is made at block 110 to determine if a new load of boot code is provided in an associated set of download buffers. If not, progress is made to block 112 to force acquisition of such new code by any suitable download mechanism. A "yes" determination in block 110 or an exit from block 112 both indicate that a valid firmware set is now available.

Figure 3:
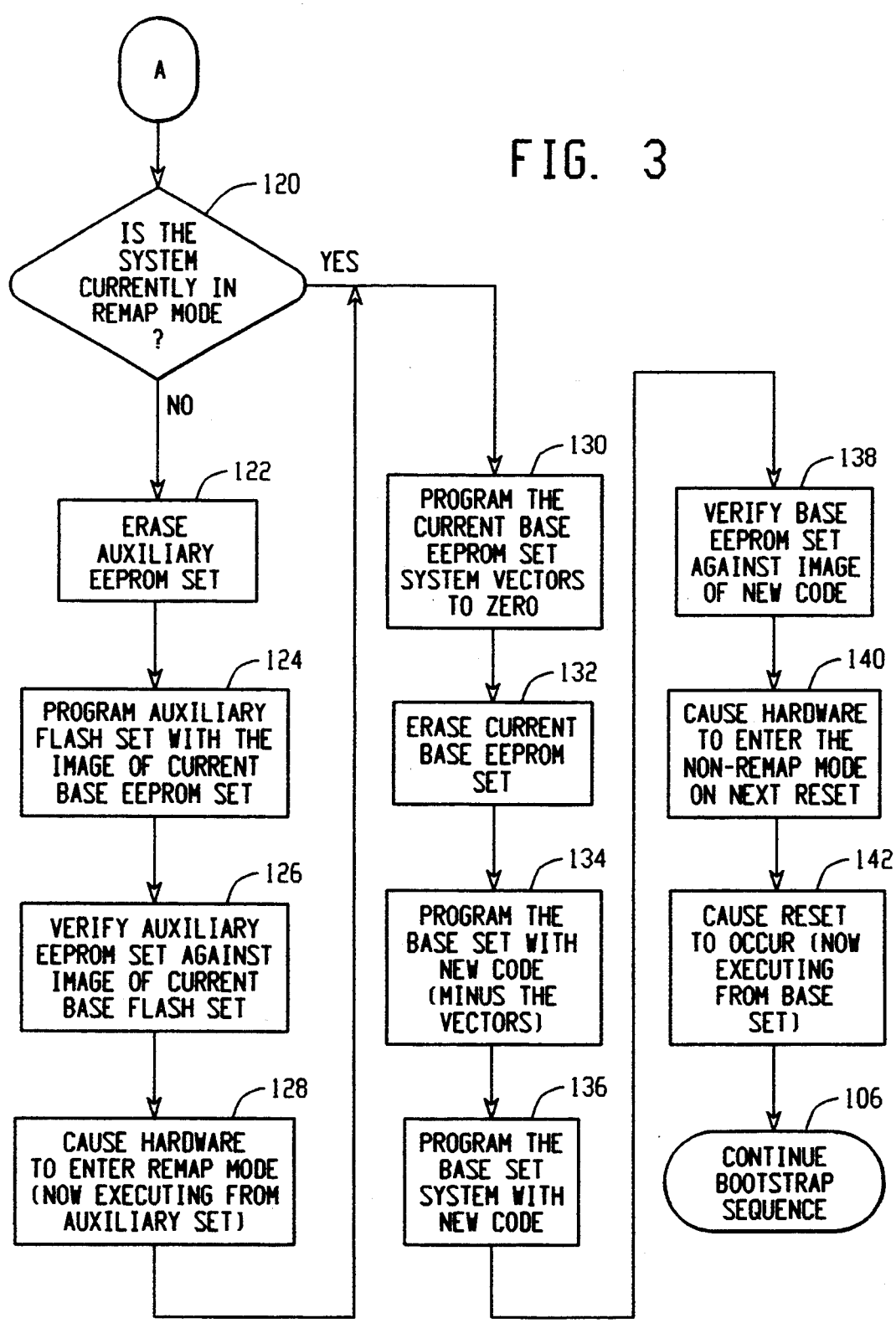

Turning now to FIG. 3, the system enters block 120. Therein, a determination is made as to whether the system is presently executing in a remaped state or mode. A positive determination made implies that the system currently has a corrupt main boot segment and is executing from the alternative firmware set (auxiliary flash set 12 of FIG. 1).

A determination that the system is not in the remap state causes progress to block 122. Accordingly, progress to this state conversely applies that the main boot segment is not currently corrupt. At this point, it is safe to erase the auxiliary flash set and provide it with a copy of the currently executed flash set. The auxiliary flash set is erased at block 122. The alternate set is then programmed with the image of the current boot set at block 124. Progress is then advantageously made to block 126, at which point the integrity of the new copy is verified. At block 128, appropriate addressing is provided to enter/exit circuitry (FIG. 1) to cause the processor 14 enter remap mode. In this fashion, the CPU 14 is converted to commence execution of bootstrap code provided in the auxiliary flash set 12.

At this point, progress is made to block 130, which point will be also achieved upon a positive determination made in the decision of block 120, which decision evidence is that the system currently is in remap mode. It will be appreciated, therefore, that in either situation, the system will be placed in remap mode by the time progress is made to block 130. At this point, a base vector set for the CPU 14 is programmed to 0. Next, at block 132, the entire base firmware (boot set) is erased. At block 134, the base firmware is then programmed with the new instructions, except for the base vector set. Next, the base vector set is complementary programmed with new instructions at block 136. The integrity of the base flash set is advantageously verified at block 138.

Progress is then made to block 140, at which point the WDMODE circuitry 40 enables the flash sets to an unremapped state at the next reset. This facilitates the boot and alternate sets to be placed back into the proper segments in the event a reset occurs. Progress is then made to block 142, at which point a hardware reset or reboot is forced. A normal bootstrap sequence is, at this point, continued at step 106.

It will be observed from the foregoing that a reset attributing to any reason, such as a power failure, which occurs during blocks 130–138 will trigger a hardware recovery mechanism and result in execution of bootstrap loader sequence disposed in the auxiliary flash sets 12. It is also to be noted that block 122, 124, 126, 130, 132, 134, 136, 138,140, and 142 involve erasing, programming, or verifying integrity of the contents of a flash set EPROM device. It is to be appreciated that any of these sections may fail due to a physical device failure. Such a physical device failure results in an abort of the process at the point at which the failure occurred.

This invention has been described with reference to the preferred embodiment. Obviously modifications and alterations will occur to others upon reading and understanding of the specification. It is our intention that all such modifications and alterations being included in so far as they come within the scope of the appending claims or equivalence thereof.

Having thus described our invention, we now claim:

1. A method of reprogramming computer software instructions in a computer system including a processor with an address base to which the computer software instructions are mapped, said method comprising the steps of:
   (a) providing a writable, non-volatile memory device having a base memory region and an auxiliary memory region;
   (b) loading a first set of initialization instructions including a boot routine into said base memory region;
   (c) selectively operating said system (i) in a normal mode in which said initialization instructions most recently loaded into said base memory region are mapped to the address base of the processor or (ii) in an auxiliary mode in which initialization instructions copied into said auxiliary memory region are mapped to the address base of the processor, to facilitate initialization of the system;
   (d) monitoring said normal mode of operation to determine if an initialization fault is detected and issuing a reset signal to said processor if an initialization fault is detected;
   (e) copying said most recently loaded initialization instructions from said base memory region into said auxiliary memory region if no fault is detected and no reset signal is issued, and then loading an updated set of initialization instructions including a boot routine to said base memory region, and repeating steps (c) through (e) until an initialization fault is detected; and
   (f) if an initialization fault is detected, switching the operation of said system to the auxiliary mode in response to said reset signal.

2. The method of claim 1, wherein said writable, non-volatile memory device is an EEPROM (electrically erasable programmable read only memory) device.

3. The method of claim 2, wherein said EEPROM device is a flash EEPROM device.

4. The method of claim 1, further comprising the step of comparing the most recently loaded initialization instructions copied from said base memory region into said auxiliary memory region to the initialization instructions currently residing in said base memory region.

5. The method of claim 4, further comprising the step of selectively mapping initialization instructions in said base memory region or said auxiliary memory region, in said normal or auxiliary modes, respectively, to the address base of the processor, using a memory address decoder.

6. The method of claim 5, wherein said timer device is a counter, and said counter issues a reset signal to said processor upon detection of an initialization fault to disrupt initialization of the system in the normal mode.

7. The method of claim 6, wherein said counter issues said reset signal after a predetermined time period elapses.

8. The method of claim 6, wherein said counter is reset at the beginning of each occurrence of said normal mode of operation.

9. The method of claim 4, wherein said step of monitoring said normal mode of operation to determine if an initialization fault is detected is performed by a timer device.

10. A device for reprogramming computer software instructions in a computer system including a processor with an address base to which the computer software instructions are mapped, said device comprising:
   (a) a writable, non-volatile memory device electrically connected to said processor, said non-volatile memory device having a base memory region and an auxiliary memory region;
   (b) circuitry electrically connected to said memory device for loading a first set of initialization instructions including a boot routine into said base memory region;
   (c) circuitry electrically connecting the processor and said memory device for selectively operating said system (i) in a normal mode in which said initialization instructions most recently loaded into said base memory region are mapped to the address base of the processor, or (ii) in an auxiliary mode in which initialization instructions copied into said auxiliary memory region are mapped to the address base of the processor, to facilitate initialization of the system;
   (d) circuitry electrically connected to the processor for monitoring said normal mode of operation to determine if an initialization fault is detected and issuing a reset signal to said processor if an initialization fault is detected;
   (e) circuitry electrically connected to said memory device for copying said most recently loaded initialization instructions from said base memory region into said auxiliary memory region if no fault is detected and no reset signal is issued, and for then loading an updated set of initialization instructions including a boot routine to said base memory region, and for operating said system in said normal mode until an initialization fault is detected; and
   (f) switching circuitry electrically connected to said memory device for switching the operation of said system to the auxiliary mode if an initialization fault is detected in response to said reset signal.

11. The device of claim 10, wherein said writable, non-volatile memory device is an EEPROM (electrically erasable programmable read only memory) device.

12. The device of claim 1, wherein said EEPROM device is a flash EEPROM device.

13. The device of claim 10, wherein said circuitry for selectively operating said system in the normal mode or the auxiliary mode includes a memory address decoder.

14. The device of claim 10, further including circuitry for comparing the most recently loaded initialization instructions copied from said base memory region into said auxiliary memory region to the initialization instructions currently residing in said base memory region.

15. The device of claim 10, wherein said circuitry for monitoring said normal mode of operation to determine if an initialization fault is detected is performed by a timer device.

16. The device of claim 15, wherein said timer device is a counter for issuing a reset signal to said processor upon detection of an initialization fault to disrupt initialization of the system in the normal mode.

17. The device of claim 16, wherein said counter issues said reset signal after a predetermined time period elapses.

18. The device of claim 16, wherein said counter is reset at the beginning of each occurrence of said normal mode of operation.

* * * * *